(12) United States Patent
Minne

(10) Patent No.: US 6,857,054 B2
(45) Date of Patent: Feb. 15, 2005

(54) WRITE-ONCE MEMORY STORAGE DEVICE

(75) Inventor: Mark W. Minne, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 225 days.

(21) Appl. No.: 10/185,648

(22) Filed: Jun. 28, 2002

(65) Prior Publication Data

US 2004/0003191 A1 Jan. 1, 2004

(51) Int. Cl.[7] .............................................. G06F 12/00
(52) U.S. Cl. ..................... 711/163; 711/103; 711/170; 711/200; 365/51; 365/52; 365/94; 365/96; 365/242
(58) Field of Search ................................. 711/103, 163, 711/170, 200; 365/51, 52, 94, 96, 242

(56) References Cited

U.S. PATENT DOCUMENTS

| 5,029,125 | A | * | 7/1991 | Sciupac ..................... 707/205 |
| 5,835,396 | A | * | 11/1998 | Zhang ........................ 365/51 |
| 6,034,882 | A | * | 3/2000 | Johnson et al. ............. 365/103 |
| 6,385,074 | B1 | * | 5/2002 | Johnson et al. ............. 365/103 |
| 6,545,891 | B1 | * | 4/2003 | Tringali et al. .............. 365/51 |
| 6,584,541 | B2 | * | 6/2003 | Friedman et al. ........... 711/103 |
| 6,675,276 | B2 | * | 1/2004 | Schulze et al. ............. 711/200 |
| 6,711,043 | B2 | * | 3/2004 | Friedman et al. ............ 365/51 |
| 2002/0184459 | A1 | * | 12/2002 | Taussig et al. ............. 711/165 |

OTHER PUBLICATIONS

Friedman et al.; "Three–Dimensional Memory Cache System", U.S. Provisional Appl. No. 60/308,330, Jul. 26, 2001.*

* cited by examiner

Primary Examiner—Donald Sparks
Assistant Examiner—Bao Q Truong

(57) ABSTRACT

The present disclosure relates to a write-once storage device. In one arrangement, the storage device comprises write-once memory adapted to store data files, re-writable memory that contains a file access table, and a device controller that is configured to control operation of the storage device. In use, the storage device can be used to receive data to be stored from a host device, store the data within write-once memory of the storage device, and update a file access table stored in re-writable memory of the storage device so as to emulate a re-writable storage card.

21 Claims, 6 Drawing Sheets

WRITE-ONCE MEMORY STORAGE DEVICE

FIELD OF THE INVENTION

The present disclosure relates to a solid-state storage device. More particularly, the present disclosure relates to a solid-state storage device that includes write-once memory.

BACKGROUND OF THE INVENTION

Solid-state storage devices have increased in popularity in recent years. By way of example, flash memory has come into common use in storage devices used with host devices such as digital cameras, music players, and the like. The memory used in these storage devices comprise re-writable memory, i.e., memory that may be written to and later re-written over.

Recently, increased attention has been focused on write-once or one time programmable (OTP) memory as an alternative to re-writable memory. One reason for this interest is that write-once memory is potentially much cheaper to produce as compared to re-writable memory. With such memory, relatively inexpensive storage devices can be created for one time use with various host devices. For instance, write-once storage devices could be used with digital cameras in similar manner to the way in which film is used in conventional cameras.

Despite the desirability of write-once memory, its use in most host devices is not currently feasible in that such devices are configured for use only with re-writable memory. For instance, most digital cameras are configured so as to permit the user to delete a captured image and store a new image (i.e., new image data) over the deleted image. Where the memory is write-once, however, such functionality is not possible and will likely result in a system error within the host device. In addition, most host devices are configured to modify the file access table of its associated storage device. Again, where the memory of the storage device is write-once, such modification is not feasible.

Although existing host devices can be reprogrammed, e.g. through the provision of new firmware, so as to be compatible with write-once memory, such reprogramming is expensive in terms of software or firmware development as well as distribution and installation. Accordingly, it can be appreciated that it would be desirable to have a storage device that includes write-once memory, so as to reduce the cost of the device, which is also compatible with existing host devices that are configured for use with re-writable memory.

SUMMARY OF THE INVENTION

The present disclosure relates to a write-once storage device. In one arrangement, the storage device comprises write-once memory adapted to store data files, re-writable memory that contains a file access table, and a device controller that is configured to control operation of the storage device.

In addition, the present disclosure relates to a method for manipulating data provided by a host device. In one arrangement, the method comprises the steps of receiving data to be stored with a storage device, storing data within write-once memory of the storage device, and updating a file access table stored in re-writable memory of the storage device.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

DETAILED DESCRIPTION

Figure 1:
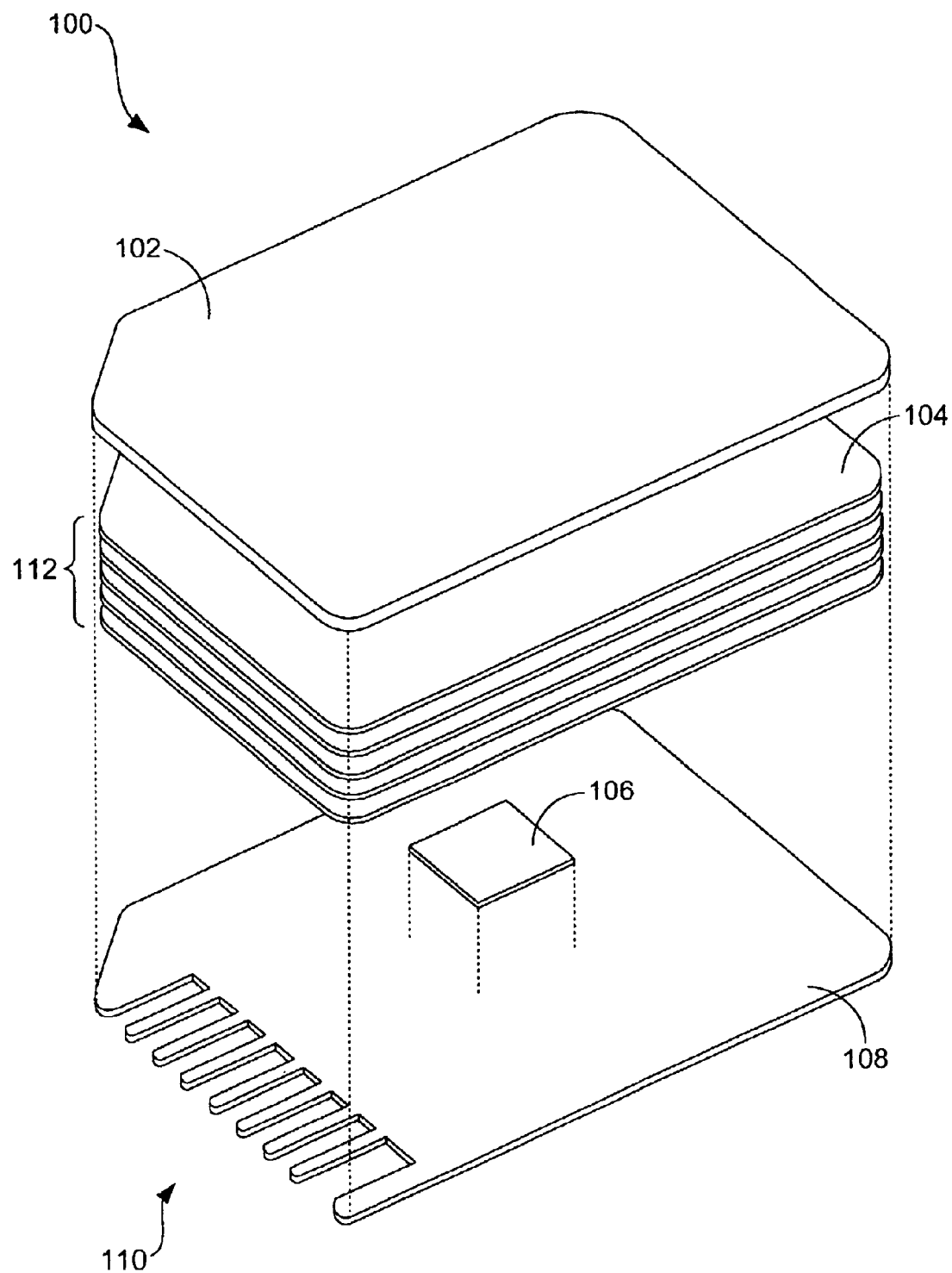
FIG. 1 is a perspective view of an example storage device that comprises write-once memory.

Referring now in more detail to the drawings, in which like numerals indicate corresponding parts throughout the several views, FIG. 1 illustrates a storage device 100 that comprises write-once memory and which is configured for use with existing host devices such as digital cameras, notebook computers, music players, handheld computers, etc. As indicated in FIG. 1, the storage device 100 can be formed as a storage card that comprises a housing 102, one or more write-once memory layers 104, a device controller 106, and a circuit board 108 that is in electrical communication with the memory layers via the device controller. In addition, the storage device 100 can include a connector 110 with which the device electrically connects with a suitable host device (not shown).

Figure 2:
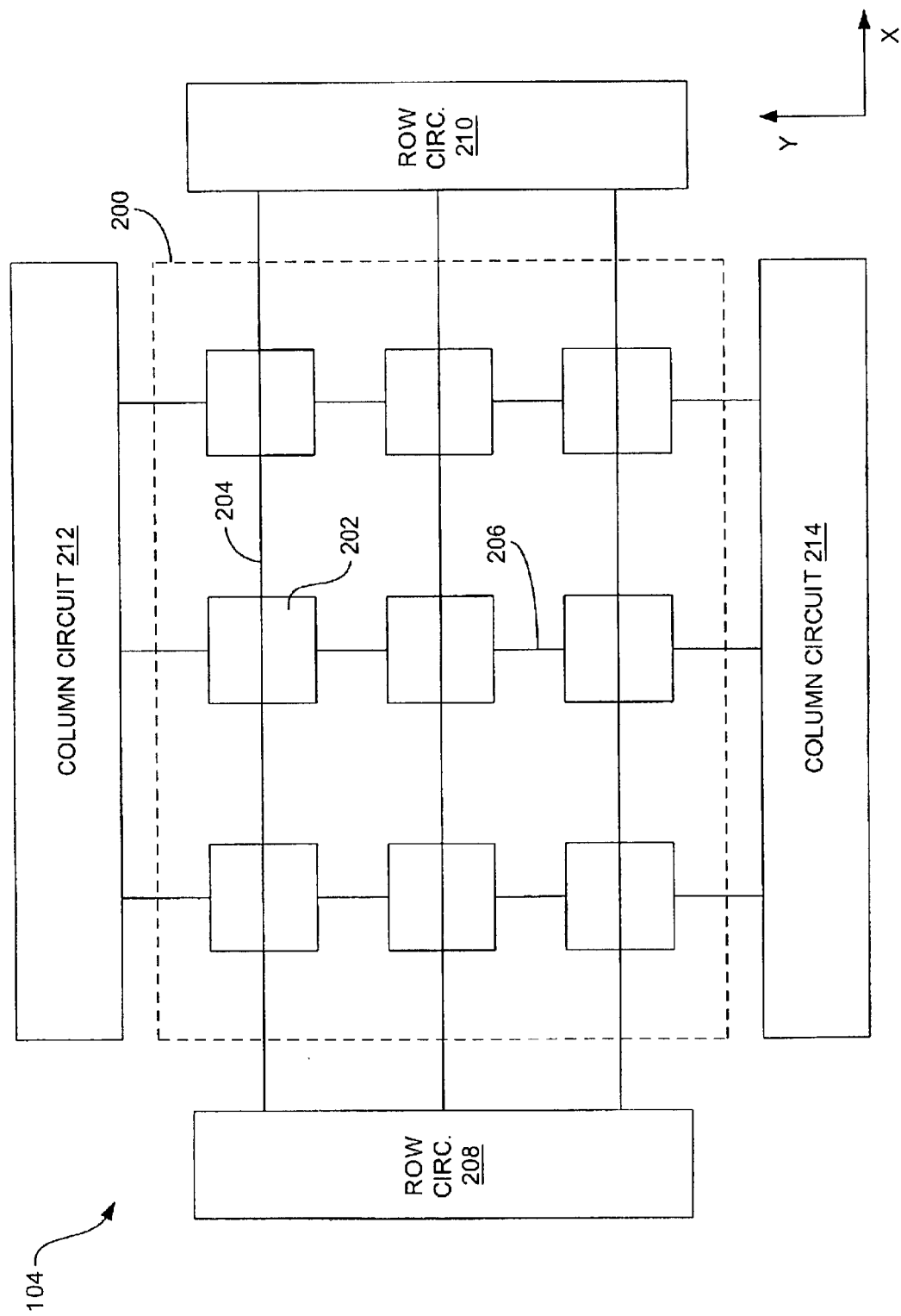
FIG. 2 is a block diagram of an example configuration of a write-once memory layer shown in FIG. 1.

Optionally, the storage device 100 can comprise a plurality of memory layers 104 that are arranged in a stack 112. By way of example, each memory layer 104 can comprise a two-dimensional, cross-point array of thin-film, write-once memory cells. FIG. 2 provides an example of a memory layer 104 that can be used in the storage device of FIG. 1. As indicated in FIG. 2, the memory layer 104 includes a two dimensional array 200 of memory cells 202 that are arranged in rows and columns, with the rows extending along an x-direction and the columns extending along a y-direction. Only a relatively small number of memory cells 202 are shown to simplify the explanation of the memory layer 104. In practice, arrays of any size may be used.

Traces functioning as word lines 204 extend along the x-direction in a first plane on one side of the array 200. Traces functioning as bit lines 206 extend along the y-direction in a second plane on an opposite side of the array 200 (see FIG. 3). There may be one word line 204 for each row of the array 200 and one bit line 206 for each column of the array 200. Each memory cell 202 is located at a cross-point of a corresponding word line 204 and bit line 206.

The memory cells 202 form a resistive cross-point array because they include resistive elements that are coupled together through many parallel paths. The resistance seen at one cross-point equals the resistance of the memory cell 202 at that cross-point in parallel with resistances of memory cells 202 in the other rows and columns.

The memory layer 104 further, includes a read/write circuit (represented by first and second row circuits 208 and 210 and first and second column circuits 212 and 214) for applying read and write potentials to selected memory cells 202 during read and write operations. To generate the read and write currents, the first and second row circuits 208 and 210 apply appropriate potentials to the word lines 204, and the first and second column circuits 212 and 214 apply appropriate potentials to the bit lines 16. As is discussed below, the second column circuit 214 also typically includes one or more sense amplifiers (see FIG. 5) for sensing the resistance states of the selected memory cells 202, which indicate the stored logic values.

Sneak path currents may present a problem during read operations because the memory cells 202 in the array 200 are coupled together through many parallel paths. If not blocked, the sneak path currents can obscure the sensing of the resistances during read operations. The sneak path currents can be blocked by, for example, providing switches or diodes (not shown) for isolating the selected cells 202 and thereby blocking the sneak path currents. Alternatively, the sneak path currents may be blocked by implementing an "equipotential" method disclosed in assignee's U.S. patent application Ser. No. 09/564,308, filed Mar. 3, 2000, which is hereby incorporated by reference into the present disclosure. In this method, a read potential may be applied to the bit line 206 crossing the selected memory cell 202 and a ground potential may be applied to the word line 204 crossing the selected memory cell. Consequently, a sense current flows through the selected memory cell 202. To prevent the sneak path currents from obscuring the sense current, the same potential is applied to a subset of unselected bit lines 206 and unselected word lines 204.

During a write operation, the read/write circuit applies write potentials to selected word and bit lines 204 and 206. Consequently, electric or magnetic fields are created about the selected word and bit lines 204 and 206. A memory cell 202 experiencing both fields, i.e. a memory cell lying at a cross-point of a selected word line 204 and a selected bit line 206, is referred to as a "selected" memory cell. All of the other memory cells 202 along the selected word line 204 will experience one of the two fields, while all of the other memory cells along the selected bit line 206 will experience the other of the two magnetic fields. The memory cells 202 experiencing one of the two magnetic fields are referred to as "half-selected" memory cells. The remaining memory cells 202 in the array 200 are referred to as "unselected" memory cells.

A write-once operation may be performed by applying first and second write potentials to the word and bit lines 204 and 206. When applied, these potentials cause a dielectric breakdown of the thin-film barrier of the selected memory cell 202. Consequently, the write potentials cause the thin-film barrier to become overstressed or damaged, and the selected memory cell is changed permanently to a low resistance state.

Figure 3:
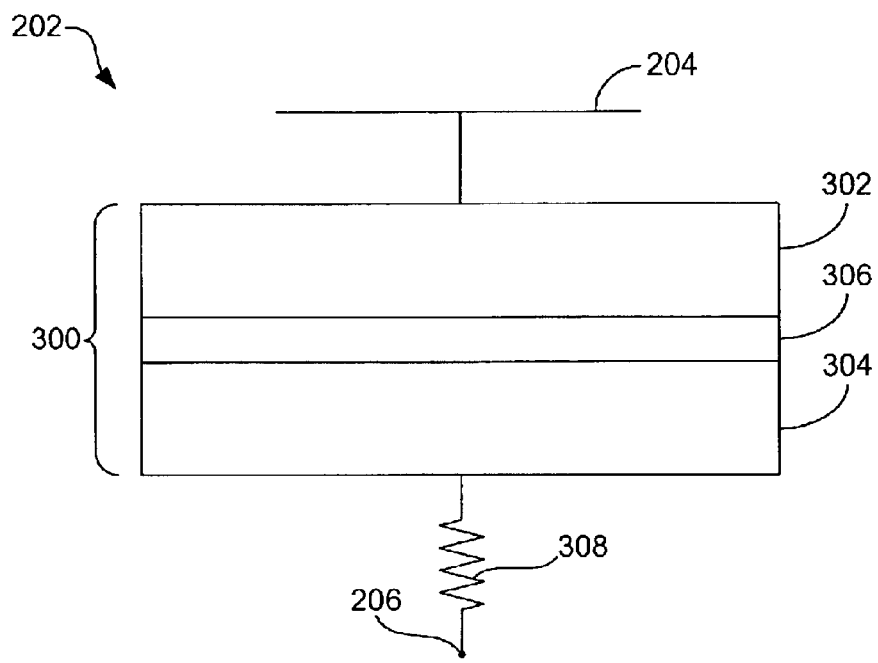
FIG. 3 is block diagram of an example memory cell that can be used in the memory layer of FIG. 2.
Figure 4:
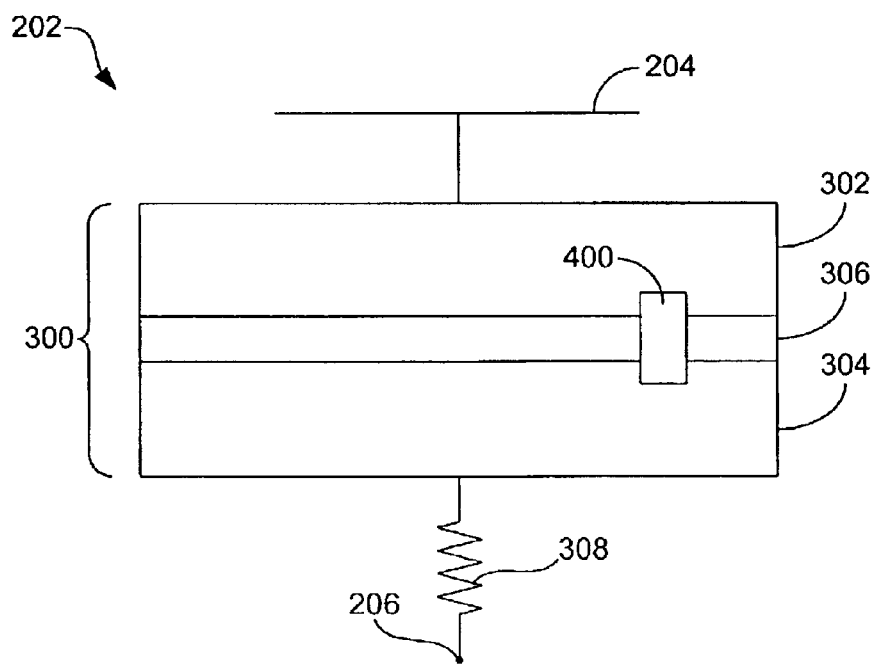
FIG. 4 is the memory cell of FIG. 3, shown in a written state.

Referring now to FIGS. 3 and 4, illustrated is an example thin-film write-once memory cell 202 at different resistance states. As indicated in these figures, the memory cell 202 includes a resistive memory element 300. The resistive memory element 300 includes first and second conductors 302 and 304 and an intermediate high-resistance, thin-film barrier 306. As will be appreciated by persons having ordinary skill in the art, the construction of the memory element can take several different forms. For instance, where the memory element 300 is formed as a spin dependent tunneling (SDT) junction, the first conductor 302 may be a free ferromagnetic layer, the second conductor 304 may be a pinned ferromagnetic layer, and the thin-film barrier 306 may be an insulating tunnel barrier. Alternatively, where the memory element 300 is formed as a polymer memory element, the first conductor 302 may be a metal, the second conductor 304 may be a metal, and the thin-film barrier 306 may be a polymer memory material. Irrespective of the element construction, the thickness of the thin-film barrier 306 is selected so the barrier breaks down when the first and second write potentials are applied. Dielectric breakdown generally occurs at a critical electric field rather than a critical voltage.

The thin-film barrier 306 of the memory cell 202 shown in FIG. 3 has not yet been broken down, overstressed, or otherwise damaged. Therefore, the memory cell 202 has a nominal resistance that corresponds to a first logic value (e.g., logic "0"). When a sense current flows through a selected memory cell 202, the thin-film barrier 306 does not break down. The thin-film barrier 306 of the memory cell 202 shown in FIG. 4, however, has already been broken down, as indicated by damage 400. Therefore, the memory cell 202, in the state shown in FIG. 4, has a resistance that is lower than the nominal. This lower resistance corresponds to the second logic value (e.g., logic "1"). By way of example, the resistance of the resistive memory element 300 shown in FIG. 3 (undamaged barrier) may be on the order of 1 mega ohm, while the resistance of the resistive memory element 300 shown in FIG. 4 (damaged barrier) may be on the order of 100 ohms to 10,000 ohms.

If a memory element 300 has a resistance near zero, it might draw excessively large read and write currents during read and write operations. To prevent such a memory element 300 from drawing large currents, a resistor 308 may be connected in series with the resistive memory element 300. The resistance of the series-connected resistor 308 typically is low enough to have a minimal effect on read operations yet high enough to have minimal effect on write operations. Thus, the actual resistance of the series-connected resistor 308 isolates the memory element 300 without degrading the sensing of the sense current during read operations and without degrading the write currents during write operations. The resistance range of the series-connected resistor 308 may be, for instance, between 0.1% and 50% of the nominal. Thus, if the resistive memory element 300 has a damaged barrier 306, the resistance of the memory cell 202 will at least be equal to the resistance of the series-connected resistor 308. Assignee's U.S. Pat. No. 6,324,093, which is hereby incorporated by reference into the present disclosure, describes examples of resistive elements that can be connected in series with memory elements.

Generally speaking, the maximum read voltage is less than the minimum write-once voltage. Thus, there is no overlap between the read and write-once voltages. Typically, the voltage for a write-once operation is applied over a short interval. Dielectric breakdown occurs very quickly once the breakdown threshold is exceeded. Therefore, write-once operations can be performed within single clock periods (e.g., 10 to 30 ns). Breakdown current can be monitored and the write-once voltage removed as soon as breakdown is detected. However, it may be simpler to apply the write-once voltage for a short, fixed period of time.

Figure 5:
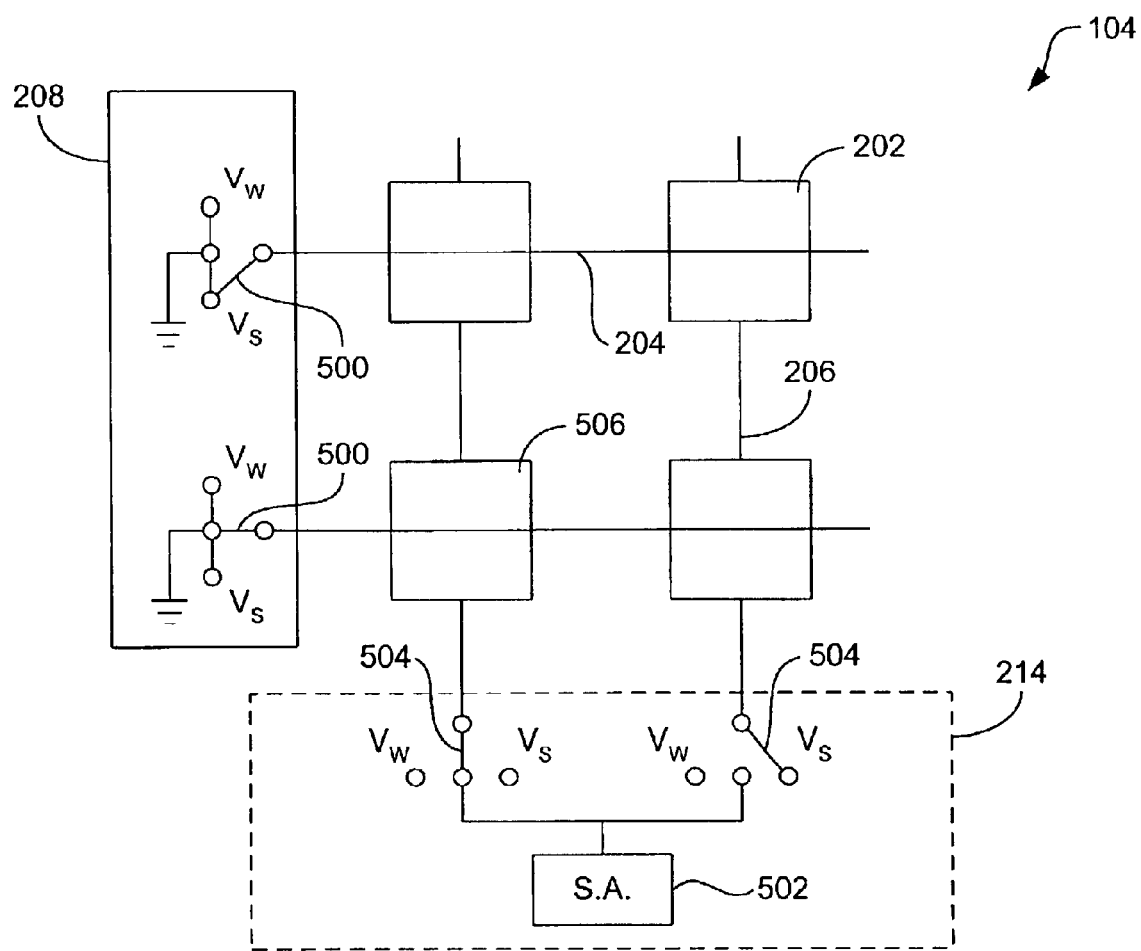
FIG. 5 is a block diagram of example row and column circuits that can be used in the configuration of FIG. 2, shown during a read operation.
Figure 6:
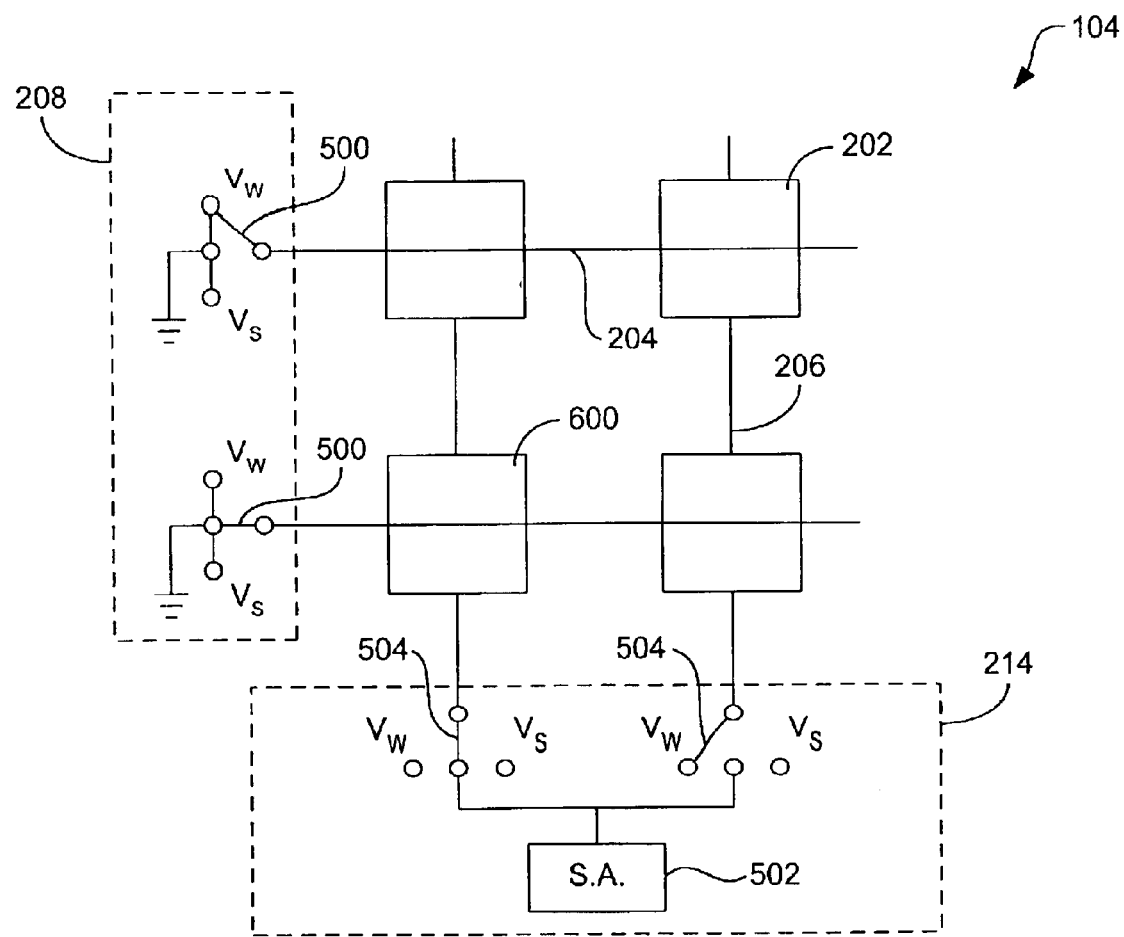
FIG. 6 illustrates the row and column circuits of FIG. 5, shown during a write operation.

Reference is now made to FIGS. 5 and 6, which show the first row and second column circuits 208 and 214 in greater detail during reading and writing operations, respectively. The first row circuit 208 includes a first switch 500 for each word line 204. The first switch 500 performs three functions: connecting the selected word lines 204 to ground for both read and write operations; connecting the unselected word lines 204 to the array voltage ($V_s$) during read operations (which allows equipotential reads to be performed); and connecting the unselected word lines 204 to the half-select write voltage ($V_w$) during a write-once operation. During read and write-once operations, the second row circuit 210 connects all word lines 204 to a high impedance (e.g., open switches) and the first column circuit 212 connects all bit lines 206 to a high impedance.

As is further indicated in FIGS. 5 and 6, the second column circuit 214 includes a sense amplifier 502 and a plurality of second switches 504. Each second switch 504 performs three functions: connecting the selected column 16 to the input of the sense amplifier 502 during read operations; connecting the unselected bit lines 206 to the array voltage ($V_s$) during read operations; and connecting the unselected bit lines 206 to a half select voltage ($V_w$) during write-once operations. When connected to a selected bit line 206, the sense amplifier 502 senses the resistance state of selected memory cells 202 during a read operation. During a write-once operation, the sense amplifier 502 applies a ground potential to write a logic "0" and twice the half-select voltage ($2V_w$) to write a logic "1". Applying twice the half-select voltage causes a breakdown.

FIG. 5 shows the first row circuit 208 and second column circuit 214 during a read operation. During a read operation, the first switches 500 tie a selected word line 204 to ground and unselected word lines 204 to the array voltage ($V_s$), and the second switches 504 connect a selected bit line 206 to the sense amplifier 502 and the unselected bit lines 206 to the array voltage ($V_s$). In the arrangement shown in FIG. 5, this results in cell 506 being read. The sense amplifier 502 applies a read potential to the selected bit line and senses a sense current.

FIG. 6 shows the first row and second column circuits 208 and 214 during a write operation. During a write-once operation, the second switches 504 apply a write potential (either GND or $2*V_w$) to one end of the selected bit line 206 and a half-select write potential ($V_w$) to the unselected bit lines 206. The first switches 500 apply a write potential (GND) to the selected word line 204 and a half select write potential (Vw) to the unselected word lines 204. The cell 202 at the cross-point of the selected bit line 206 and the selected word line 204 (cell 600 in FIG. 6) sees a voltage ($2*V_w$) greater than the breakdown voltage to write a logic "1" or a zero voltage to write a logic "0", while all the unselected memory cells see either a zero voltage or a half-select voltage.

The above-described thin-film, write-once memory has a higher density than erasable programmable read only memory (EPROM) and fuse programmable memory. The write-once memory also uses lower voltages during operation than do EPROM and fuse programmable memory which, in turn, results in less structural damage and higher reliability for the memory layer 104. The lower read and write voltages also make the thin-film write-once memory compatible with leading edge complementary metal oxide semiconductor (CMOS) technologies.

The thin-film write-once memory can be fabricated using the same components and process technology used in fabricating re-writable memory. In addition, the write-once memory has a robust read operation with the difference between logic "1" and "0" states being relatively large. For example, a write "0" may be represented by a resistance of 1 mega ohm, while a write "1" may be represented by a low resistance of 1,000 ohms. Such a large difference is relatively easy to detect, and therefore simplifies the read circuit design.

Although a specific type of write-once memory has been described above in detail with relation to FIGS. 2–6, it is to be understood that the described memory is merely illustrative of various types of write-once memory that may be used in the construction of the storage device. Therefore, the above-description is not intended to limit present disclosure to any specific type of write-once memory. Other examples of write-once memory that may be suitable for use in the storage device 100 are described in assignee's U.S. Pat. No. 6,324,093 and U.S. patent application Ser. No. 09/964,768, filed on Sep. 28, 2001, both of which are hereby incorporated by reference into the present disclosure.

Figure 7:
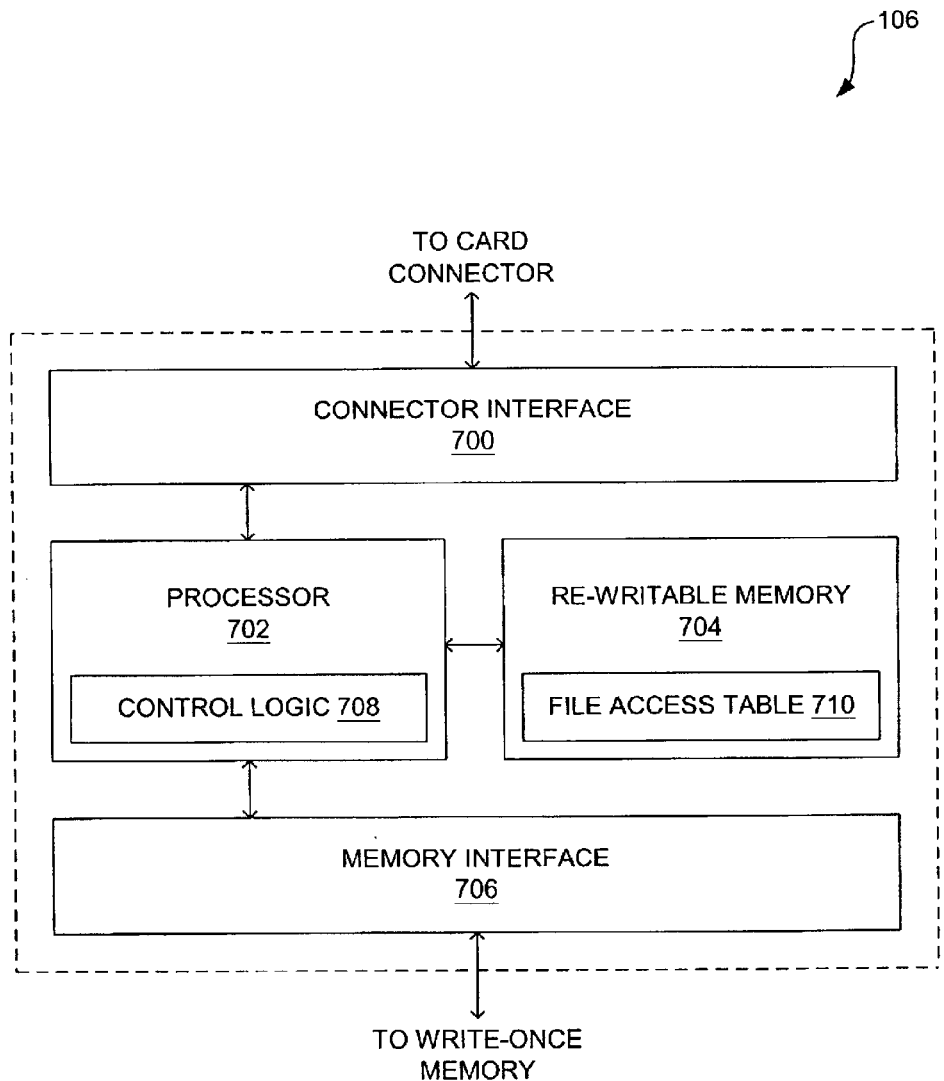
FIG. 7 is a block diagram of an example controller that can be used in the storage device of FIG. 1.

FIG. 7 provides a block diagram of the device controller 106 shown in FIG. 1. Depending upon the implementation, the device controller 106 can be formed within base silicon on which the memory layers 104 are disposed, or can be formed as a separate silicon chip that is electrically connected to the memory layers. In any case, the controller 106 can comprise, for example, a connector interface 700, a processor 702, re-writable memory 704, and a memory interface 706. As indicated in FIG. 7, the connector interface 700 is coupled to the storage device connector (110) and, thereby, links the controller 106 to the host device with which the storage device 100 is used. The processor 702 receives commands from the host device via the connector interface 700. For instance, the processor 702 may receive read and write commands that specify linear addresses that can be converted to actual memory addresses with reference to control logic 708 associated with the processor. This control logic 708 typically comprises the low level knowledge (e.g., in firmware) of the device memory and addressing.

As noted above, problems can occur if write-once memory is used in conjunction with a host device that is configured to utilize re-writable memory. For instance, the host device typically may be configured to modify the file access table of the storage device for a variety of different purposes. Such problems can be avoided, however, if the host device is "tricked" into believing that the subject storage device is in fact a conventional re-writable storage device. If this occurs, use of the write-once storage device will be transparent to the host device. This transparency can be achieved by both storing a file access table 710 in re-writable memory 704 to permit the host device to make modifications to the table, and emulating the actions of a conventional re-writable storage device in response to various host device actions such that system errors will not arise.

With the file access table 708 stored in the re-writable memory 704 of the controller 106, the host device is capable of updating the table with various information such as the file name, file size, file location, number of times the file has been accessed, etc. The nature of the emulation of a conventional re-writable storage device depends upon the configuration of the host device with which the storage device 100 is used. For host devices that recognize write-protection, each file stored in the storage device can be automatically designated as write-protected by the controller 106 such that no faults occur as a result of an attempt to re-write over an existing file. Where, on the other hand, the host device does not recognize write-protection, the controller 106 can mimic deletion and re-writing of files for the host to provide transparent operation. For instance, where the host device comprises a digital camera and its user attempts to delete a given captured image, the controller 106 can receive the "delete" command and feign deletion of the given file by returning indication to the host device that the file has indeed been deleted. In such a situation, the controller 106 also updates the indication of the space available for storage in that the designated file, being stored in write-once memory, cannot in fact be deleted and the memory space reused to store new data.

In either of the emulation scenarios described above, collateral benefits can be obtained. For instance, in the digital camera context, by selecting to delete a given image file, the controller 106 can tag the file in the file access table 710 as being a file that is not to be printed for the user/customer. In that the file access table is stored in the re-writable memory 704, further developing/printing information can be provided to the developer or photo finisher including, for instance, what format in which to print a given image (standard, wide, etc.), which images for which double prints are to be provided, and the like.

While particular embodiments of the invention have been disclosed in detail in the foregoing description and drawings for purposes of example, it will be understood by those skilled in the art that variations and modifications thereof can be made without departing from the scope of the invention as set forth in the following claims.

What is claimed is:

1. A write-once storage device for use with a host device, comprising:

write-once memory adapted to store data files;

re-writable memory that contains a file access table; and a device controller that is configured to control operation of the storage device such that responsive to the host device attempting to modify the file access table, the controller device enables the file access table contained in the re-writable memory to be modified.

2. The storage device of claim 1, wherein the write-once memory comprises a cross-point array of memory cells.

3. The storage device of claim 2, wherein the memory cells are manipulable so as to have a first resistance state that corresponds to a first logic value and a second resistance state that corresponds to a second logic value.

4. The storage device of claim 3, wherein the write-once memory further comprises a read/write circuit with which potentials can be provided to the memory cells to switch the cells from the first resistance state to the second resistance state.

5. The storage device of claim 1, wherein the re-writable memory comprises flash memory.

6. The storage device of claim 1, wherein the storage device is formed as a storage card that is configured for insertion within the host device.

7. A write-once storage device for use with a host device, comprising:

write-once memory adapted to store data files;

re-writable memory that contains a file access table; and a device controller that is configured to control operation of the storage device;

wherein the device controller comprises logic that is configured to emulate a re-writable storage device.

8. The storage device of claim 7, wherein the storage device is formed as a storage card that is configured for insertion within the host device.

9. A write-once storage device for use with a host device, comprising:

a plurality of memory layers that comprise write-once memory, the memory layers being arranged in a stacked orientation and adapted to store data files;

re-writable memory that contains a file access table which holds information about the data files stored in the write-once memory; and a device controller that controls operation of the storage device, the device controller including logic configured to emulate a re-writable storage device.

10. The storage device of claim 9, wherein the write-once memory comprises a cross-point array of memory cells.

11. The storage device of claim 10, wherein the memory cells are manipulable so as to have a first resistance state that corresponds to a first logic value and a second resistance state that corresponds to a second logic value.

12. The storage device of claim 11, wherein the write-once memory further comprises a read/write circuit with which potentials can be provided to the memory cells to switch the cells from the first resistance state to the second resistance state.

13. The storage device of claim 9, wherein the re-writable memory comprises flash memory.

14. The storage device of claim 9, wherein the storage device is formed as a storage card that is configured for insertion within the host device.

15. A method for manipulating data provided by a host device, comprising:

receiving data to be stored with a storage device;

storing data within write-once memory of the storage device; and updating a file access table stored in re-writable memory of the storage device.

16. The method of claim 15, further comprising designating data stored within the write-once memory as write-protected.

17. The method of claim 15, further comprising receiving a command to delete data from the host device and emulating deletion of the data for the host device.

18. The method of claim 15, wherein the storing data comprises storing data in write-once memory that comprises a cross-point array of memory cells.

19. The method of claim 18, wherein storing data comprises manipulating the cells so as to alter the resistance of selected cells.

20. The method of claim 19, wherein storing data comprises manipulating the cells so as to reduce the resistance of selected cells.

21. The method of claim 15, wherein the storage device comprises a storage card.

* * * * *

UNITED STATES PATENT AND TRADEMARK OFFICE
CERTIFICATE OF CORRECTION

| | |
|---|---|
| PATENT NO. | : 6,857,054 B2 |
| APPLICATION NO. | : 10/185648 |
| DATED | : February 15, 2005 |
| INVENTOR(S) | : Mark W. Minne |

It is certified that error appears in the above-identified patent and that said Letters Patent is hereby corrected as shown below:

In column 1, line 25, delete "mariner" and insert -- manner --, therefor.

In column 8, line 43, in Claim 18, after "wherein" delete "the".

Signed and Sealed this

Sixteenth Day of March, 2010

David J. Kappos
*Director of the United States Patent and Trademark Office*